United States Patent [19]
Honnigford

[11] Patent Number: 5,528,190
[45] Date of Patent: Jun. 18, 1996

[54] CMOS INPUT VOLTAGE CLAMP

[75] Inventor: Edward H. Honnigford, Russiaville, Ind.

[73] Assignee: Delco Electronics Corporation, Kokomo, Ind.

[21] Appl. No.: 316,958

[22] Filed: Oct. 3, 1994

[51] Int. Cl.$^6$ .......................... H03K 5/08; H03K 17/16
[52] U.S. Cl. .......................... 327/328; 327/318; 327/323; 326/30
[58] Field of Search ..................... 327/328, 327, 327/318, 319, 320, 321, 323, 309, 312, 391, 437; 326/24, 25, 81, 30, 33, 71

[56] References Cited

U.S. PATENT DOCUMENTS

| | | | |
|---|---|---|---|
| 4,590,394 | 5/1986 | Pace | 327/318 |
| 4,874,967 | 10/1989 | Deane | 327/321 |
| 4,908,528 | 3/1990 | Huang | 326/24 |
| 4,958,093 | 9/1990 | Kosson et al. | 327/321 |
| 5,021,747 | 6/1991 | Isham et al. | 327/328 |
| 5,027,008 | 6/1991 | Runaldue | 326/30 |
| 5,159,216 | 10/1992 | Taylor et al. | 326/30 |
| 5,206,544 | 4/1993 | Chen et al. | 326/30 |

Primary Examiner—Timothy P. Callahan
Assistant Examiner—Eunja Shin
Attorney, Agent, or Firm—Jimmy L. Funke

[57] ABSTRACT

A voltage clamping circuit is provided for clamping the input voltage to CMOS devices near the rail voltages so as to prevent forward biased junctions, minority carrier injection and crosstalk between voltage inputs. The voltage clamping circuit receives an input voltage and provides an output voltage within a rail-to-rail voltage range. The clamping circuit has a bias circuit with a PMOS device for providing a p-channel threshold drop to an upper rail voltage so as to generate an upper threshold bias voltage. The bias circuit also has an NMOS device for providing an n-channel threshold increase to a lower rail voltage so as to generate a lower threshold bias voltage. A first clamping transistor is coupled to the input for clamping the input voltage so as to prevent the input voltage from rising above the upper rail voltage. A second clamping transistor is coupled to the input for clamping the input voltage so as to prevent the input voltage from dropping below the lower rail voltage. Gain stages control the clamping transistors in response to the upper and lower threshold bias voltages and the input voltage so as to cause the clamping transistors to clamp the input voltage.

12 Claims, 2 Drawing Sheets

CM OS INPUT VOLTAGE CLAMP

BACKGROUND OF THE INVENTION

1. Technical Field

This invention relates generally to a voltage clamping circuit and, more particularly, to a circuit for clamping input voltages to CMOS integrated circuits near the voltage rails and preventing forward biasing of semiconductor junctions.

2. Discussion

Clamping devices are commonly employed to limit the voltage input to electrical circuits, and are especially important for maintaining a reliable rail-to-rail voltage input so as to prevent damage to integrated circuitry on a semiconductor chip. Voltage clamping is particularly significant with regard to the CMOS family of digital logic circuits. Without the proper clamping device, the delicate input circuits to CMOS integrated circuitry may be easily destroyed if the input voltage deviates from the rail-to-rail output voltage range.

More specifically, when CMOS integrated circuitry is subjected to positive voltage transients, it is generally necessary to prevent the input voltage from exceeding the upper rail voltage limit. Excessive voltage inputs, which could be caused by static electricity discharges that may occur during handling operations, could damage the electrical circuitry. Similarly, when CMOS integrated circuitry is subjected to negative transients, it is generally desirable to prevent the input voltage from falling below the lower rail voltage limit. Quite often, the lower voltage rail limit is set to ground. Negative transients can potentially cause undesirable effects such as the inducement of excessive current leakage through the associated semiconductor chip. Furthermore, the existence of positive or negative transients outside of the rail-to-rail voltage range can cause undesirable crosstalk between multiplexed inputs.

To handle the positive voltage transient situation, conventional clamping approaches have employed diode clamps. According to this approach, input-protection diodes are typically added to the positive rail input and operate to prevent an input voltage from exceeding a selected upper rail voltage limit. For negative voltage transients, conventional approaches commonly rely on the forward biasing of a parasitic input junction to the CMOS substrate to suppress adverse effects caused by the input voltage falling below the lower rail voltage.

According to the conventional approaches, positive and/or negative transient voltages can be clamped by allowing junctions to forward bias and, in the negative transient, cause minority carrier injection into the semiconductor substrate. A CMOS chip can go into a "latchup" state if the input voltage is driven beyond the supply voltage. The resulting current through the clamp diodes generally turns "on" a pair of parasitic cross-connected transistors that are a side effect of the junction isolated CMOS process. Furthermore, with the diode clamp, the input voltage may drop below ground through the inherency of the parasitic diode. That is, if the input voltage goes below ground, the parasitic diode turns "on" and causes an undesirable reverse current which can result in undesirable current leakage through associated CMOS devices on the semiconductor chip.

Prior art approaches, such as the above parasitic diode approach, generally tend to suffer for a number of reasons. For example, the presence of undesirable reverse currents can affect circuit accuracy and possibly lead to circuit damage. In addition, the conventional parasitic approach generally operates with a dependency on process and temperature conditions. As a consequence, changing conditions may effect the accuracy of the input voltages and thus diminish the reliability of the CMOS integrated circuits over varying conditions.

It is therefore desirable to provide for a circuit for clamping input voltages to CMOS devices which prevents forward biased junctions.

It is also desirable to provide for a voltage clamping circuit for CMOS integrated circuits which prevents undesirable current leakage and minority carrier injection into the substrate.

It is further desirable to provide for a voltage clamping circuit which may clamp CMOS IC input voltages near the rails independent of process and temperature conditions.

SUMMARY OF THE INVENTION

In accordance with the teachings of the present invention, a voltage clamping circuit is provided for clamping voltage inputs to CMOS devices. The circuit includes an input for receiving an input voltage and an output for providing an output voltage within a rail-to-rail voltage range. The clamping circuit has a bias circuit with a first input for receiving an upper rail voltage and a PMOS device for providing a p-channel threshold drop to the upper rail voltage so as to generate an upper threshold bias voltage. The bias circuit has a second input for receiving a lower rail voltage and an NMOS device for providing an n-channel threshold increase to the lower rail voltage so as to generate a lower threshold bias voltage. The voltage clamping circuit has a first clamping transistor coupled to the input for clamping the input voltage so as to prevent the input voltage from rising above the upper rail voltage. A second clamping transistor is coupled to the input for clamping the input voltage so as to prevent the input voltage from dropping below the lower rail voltage. A first gain stage controls the first clamping transistor in response to the upper threshold bias voltage and the input voltage so as to cause the first clamping transistor to clamp the input voltage. A second gain stage controls the second clamping transistor in response to the lower threshold bias voltage and the input voltage so as to cause the second clamping transistor to clamp the input voltage.

BRIEF DESCRIPTION OF THE DRAWINGS

Other objects and advantages of the present invention will become apparent to those skilled in the art upon reading the following detailed description and upon reference to the drawings in which.

DETAILED DESCRIPTION OF THE PREFERRED EMBODIMENT

Figure 1:
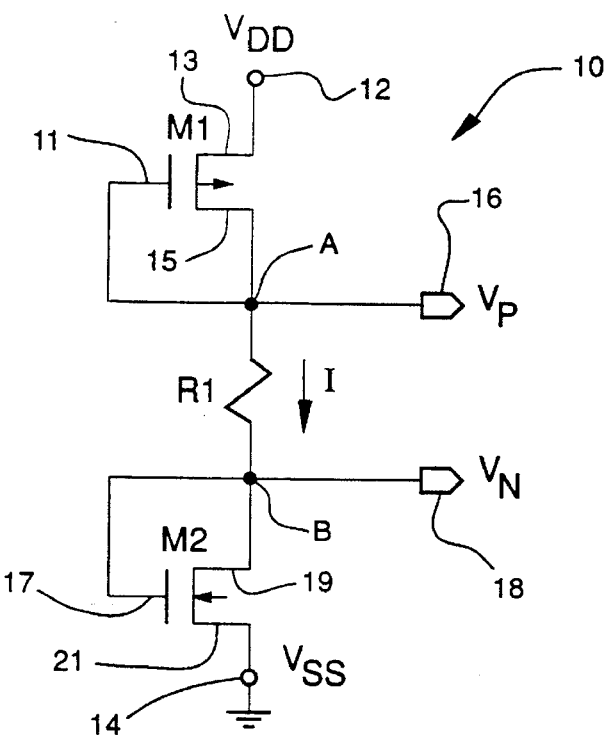
FIG. 1 is a circuit diagram of a bias circuit which generates bias reference voltages for use with the present invention.

Turning now to FIG. 1, a bias circuit 10 is shown therein for generating a pair of bias reference voltages $V_P$ and $V_N$ which in turn are employed by a clamping circuit according to the present invention. The bias circuit 10 is electrically coupled to an upper rail voltage $V_{DD}$ and a lower rail voltage $V_{SS}$. Upper and lower rail voltages $V_{DD}$ and $V_{SS}$ are commonly employed as rail-to-rail supply voltage inputs to complementary MOS (CMOS) devices for defining the voltage operating range (i.e., output swing) thereof. Quite often, lower rail voltage $V_{SS}$ is coupled to ground, while upper rail voltage $V_{DD}$ is connected to a positive DC supply voltage up to +15 volts.

The bias circuit 10 includes a diode connected p-channel MOSFET (PMOS) transistor M1 and a diode connected n-channel MOSFET (NMOS) transistor M2. PMOS transistor M1 has a source terminal 13 connected to an upper rail voltage input terminal 12 for receiving the upper rail voltage $V_{DD}$. PMOS transistor M1 also has a drain terminal 15 and a gate terminal 11, both of which are commonly joined at node A. Node A, in turn, is coupled to an upper bias output 16 for outputting a p-channel reference voltage $V_P$. Reference voltage $V_P$ is employed as an upper bias output voltage.

The NMOS transistor M2 has a source terminal 21 coupled to a lower rail voltage input terminal 14 for receiving the lower rail voltage $V_{SS}$. As is quite often the situation for CMOS devices, lower rail voltage terminal 14 may commonly be connected to ground. NMOS transistor M2 also has a gate terminal 17 and a drain terminal 19, both of which are commonly joined together at node B. Node B, in turn, is coupled to a lower bias output 18 for outputting an n-channel reference voltage $V_N$. Reference voltage $V_N$ is employed as a lower bias output voltage.

The PMOS transistor M1 is connected in series with the NMOS transistor M2 via a resistor R1. More specifically, resistor R1 is connected between node A and node B. A small current I generally ranging from approximately 5 to 50 microamps flows from upper rail voltage $V_{DD}$ to lower rail voltage $V_{SS}$ and through resistor R1. Accordingly, current I is essentially controlled by the threshold drop of transistors M1 and M2 and resistor R1.

In accordance with the bias circuit configuration shown in FIG. 1, the upper bias output voltage $V_P$ will be approximately one p-channel threshold drop below upper rail voltage $V_{DD}$. Likewise, the lower bias output voltage $V_N$ will be approximately one n-channel threshold above lower rail voltage $V_{SS}$. A p-channel threshold drop typically amounts to a voltage potential drop of approximately 1.0 volts, while an n-channel threshold will amount to a rise of approximately 1.0 volts. It should be apparent that the p-channel threshold drop and n-channel threshold rise may vary depending on the process and amount of current I. Accordingly, output bias reference voltages $V_P$ and $V_N$ are bias references employed for p-channel and n-channel current mirrors and voltage references as will be described below in connection with the circuit provided in FIG. 2.

Figure 2:
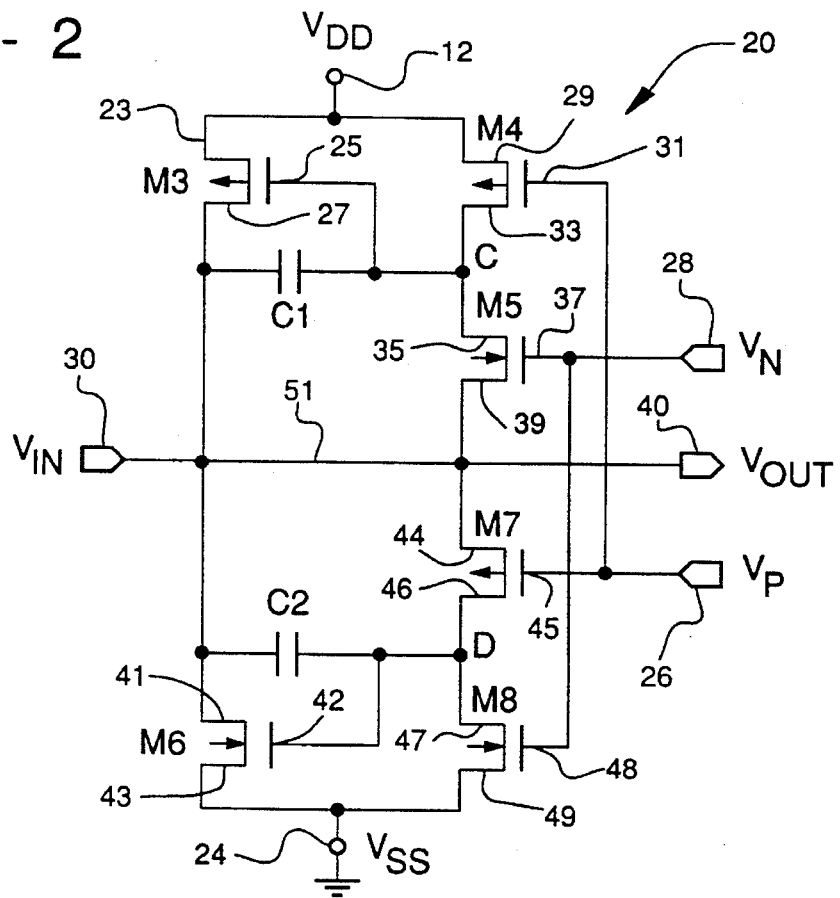
FIG. 2 is a circuit diagram of a voltage clamping circuit according to the present invention.

Referring now to FIG. 2, a voltage clamping circuit 20 is shown according to the present invention. Voltage clamping circuit 20 includes a pair of rail-to-rail voltage input terminals 26 and 28 for receiving bias output voltages $V_P$ and $V_N$, respectively. Voltage clamping circuit 20 further includes an input terminal 30 for receiving an input voltage $V_{IN}$ and an output terminal 40 for providing a voltage clamped output voltage $V_{OUT}$. Output voltage $V_{OUT}$ is thereafter supplied as an input to CMOS devices (not shown), and is particularly suited to feed CMOS integrated circuitry.

The voltage clamping circuit 20 essentially includes two similar circuits, one for clamping input voltage $V_{IN}$ from going below lower rail voltage $V_{SS}$ and the other for clamping input voltage $V_{IN}$ from going above the upper rail voltage $V_{DD}$. To clamp high or positive voltages, voltage clamping circuit 20 employs three transistors M6, M7 and M8. Transistor M6 is an n-channel MOSFET transistor referred to herein as a first clamping transistor. First clamping transistor M6 has a gate terminal 42 coupled to node D and a source terminal 43 coupled to the lower rail voltage input terminal 24 for receiving lower rail voltage $V_{SS}$. Clamping transistor M6 further includes a drain terminal 41 which is connected to a signal line 51. Signal line 51 connects input terminal 30 with output terminal 40.

Transistor M7 is a p-channel MOSFET transistor which has a gate terminal 45 connected to the upper bias voltage input 26 for receiving upper threshold voltage $V_P$. Transistor M7 further includes a source terminal 44 coupled to signal line 51 which is connected between the input and output terminals 30 and 40. A drain terminal 46 of transistor M7 is also coupled to node D.

Transistor M8 is an n-channel MOSFET transistor which has a drain terminal 47 coupled to node D. Transistor M8 has a gate terminal 48 connected to the lower bias voltage input 28 for receiving the lower threshold voltage $V_N$. A source terminal 49 of transistor M8 is further coupled to the lower rail voltage terminal 24 for receiving lower rail voltage $V_{SS}$.

The clamping circuit 20 as described thus far has a first active gain stage made up of transistors M7 and M8 and a first clamping transistor M6. However, a single transistor M7 may be used alone to provide the necessary gain stage. A feedback capacitor C2 is connected between the first gain stage and clamping transistor M6 for purposes of providing compensation in order to obtain stability around the point where clamping operations occur. More specifically, feedback capacitor C2 is connected between the drain terminal 41 of clamping transistor M6 and node D. Thus, capacitor C2 also forms a feedback connection across the gate and drain terminals 42 and 41 of clamping transistor M6.

Voltage clamping circuit 20 likewise includes three similarly connected transistors M3, M4 and M5 for purposes of performing a similar function of clamping-so as to prevent input voltage $V_{IN}$ from going below the lower rail voltage $V_{SS}$. Transistor M3 is a p-channel MOSFET transistor herein referred to as a second clamping transistor. Second clamping transistor M3 has a source terminal 23 connected to the upper rail input terminal 12 for receiving the upper rail voltage $V_{DD}$. Clamping transistor M3 also has a gate terminal 25 coupled to node C and a drain terminal 27 coupled to line 51 which is connected between input and output terminals 30 and 40.

Transistor M4 is a p-channel MOSFET transistor which has a source terminal 29 connected to the upper rail voltage input 12 for receiving upper rail voltage $V_{DD}$. A drain terminal 33 of transistor M4 is connected to node C. Transistor M4 further has a gate terminal 31 connected to the upper bias-voltage input terminal 26 for receiving the upper threshold voltage $V_P$.

Transistor M5 is an n-channel MOSFET transistor which has a gate terminal 37 connected to the lower bias voltage input terminal 28 for receiving lower threshold voltage $V_N$. A drain terminal 35 of transistor M5 is also connected to node C. Transistor M5 further has a source terminal 39 coupled to line 51 and thus source terminal 39 is therefore coupled between input and output terminals 30 and 40.

The portion of the clamping circuit 20 which includes transistors M3, M4 and M5 likewise has a second active gain stage made up of transistors M4 and M5, and a second clamping transistor M3. However, transistor M5 may be used alone to provide the necessary gain stage. A feedback capacitor C1 is connected between the second gain stage and second clamping transistor M3 for purposes of providing compensation in order to obtain stability around the point where clamping operations occur, similar to the function capacitor C1 is connected between the drain terminal 27 of transistor M3 and node C. Thus, capacitor C1 also forms a feedback connection across the drain terminal 27 and gate terminal 25 of second clamping transistor M3.

Figure 3:
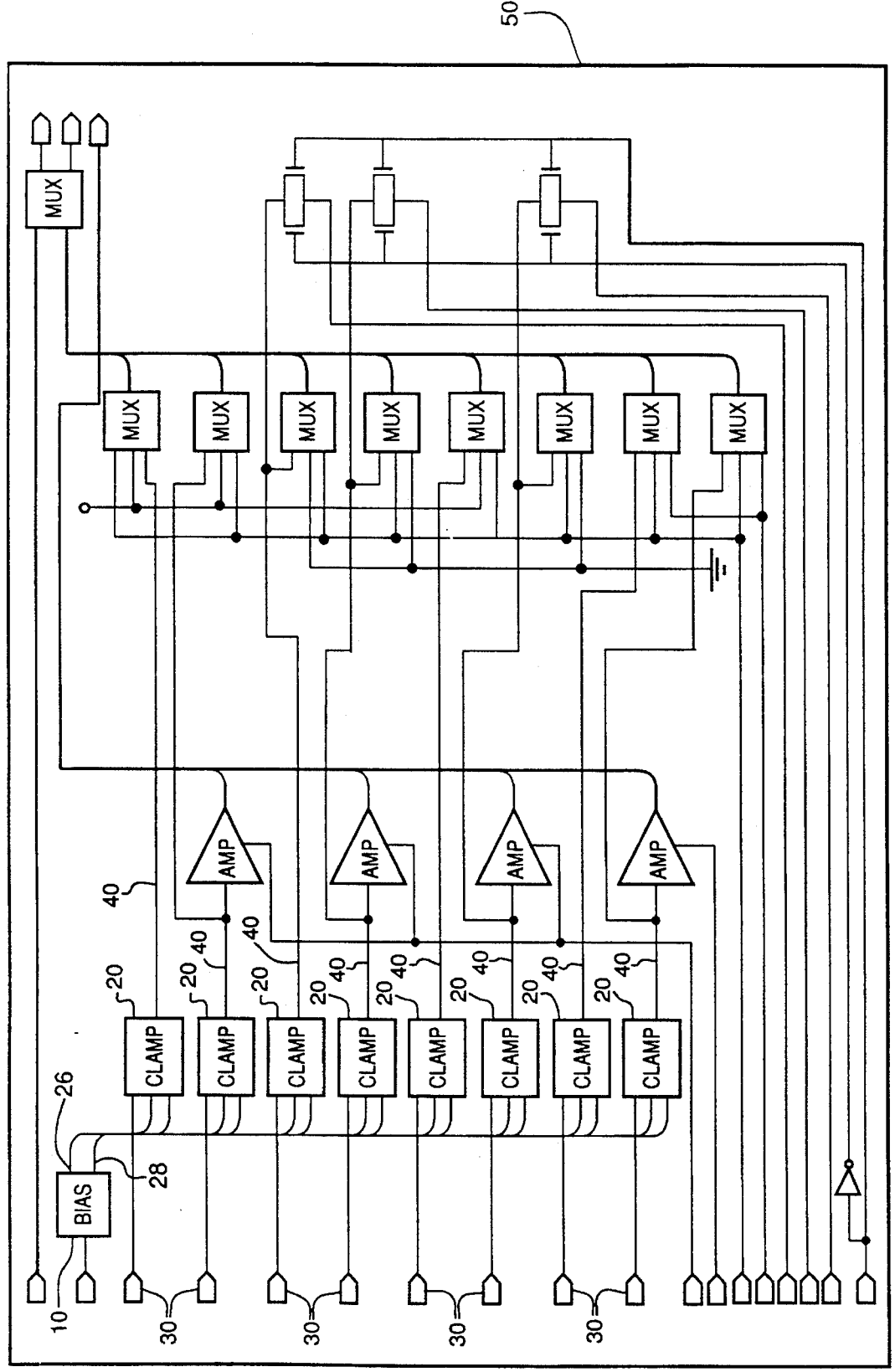
FIG. 3 is a chip layout which illustrates the bias circuit and a plurality of voltage clamping circuits employed on a CMOS semiconductor chip according to an illustrative example.

As previously mentioned, the present invention is particularly suited for clamping input voltages $V_{IN}$ so as to prevent the input voltage $V_{IN}$ from deviating from the rail-to-rail voltage operating range for CMOS integrated circuit (IC) devices on a semiconductor chip. With particular reference to FIG. 3, an example of the bias circuit 10 and a plurality of voltage clamping circuits 20 are shown formed on a semiconductor chip along with CMOS integrated circuitry. According to this example, a plurality of voltage clamping circuits 20 may be employed to provide multiple input protection lines to CMOS circuit devices. In doing so, the single bias circuit 10 may be used to generate the high and low threshold voltages $V_P$ and $V_N$ which in turn may be supplied to and employed by the plurality of voltage clamping circuits 20. Thus, a single bias circuit 10 may supply multiple voltage clamping circuits 20.

In operation, the bias circuit 10 receives the normal rail-to-rail voltage supply signals $V_{DD}$ and $V_{SS}$ which are typically supplied to CMOS integrated circuitry and which define the rail-to-rail voltage output swing thereof. The bias circuit 10, with the use of transistors M1 and M2, generates a pair of threshold voltages $V_P$ and $V_N$. Threshold voltage $V_P$ is approximately one p-channel threshold below upper rail voltage $V_{DD}$, while threshold voltage $V_N$ is approximately one n-channel threshold above lower rail voltage $V_{SS}$. Threshold voltages $V_P$ and $V_N$ are then employed by the voltage clamping circuit 20 for purposes of determining the bias or turn "on" of clamping transistors M3 and M6.

Threshold voltages $V_P$ and $V_N$ are supplied to the voltage clamping circuit 20 via terminals 26 and 28. As previously mentioned, voltage clamping circuit 20 essentially is made up of two circuits, one circuit for preventing input voltages from exceeding the upper rail voltage limit, and another circuit for preventing input voltages from dropping below the lower rail voltage limit. To clamp positive or upper voltages, transistors M6, M7 and M8 are employed. A first gain stage formed by transistors M7 and M8 operates to turn "on" first clamping transistor M6. Since the gate terminal 45 of transistor M7 is connected to upper threshold voltage $V_P$, the gate terminal 45 of transistor M7 will be at approximately $V_{DD}$ minus a p-channel threshold. The gate terminal 48 of transistor M8 which is connected to the lower threshold voltage $V_N$ will act as a current mirror to transistor M2 in the bias circuit 10. If the input voltage $V_{IN}$ is less than the upper rail voltage $V_{DD}$, then transistor M7 will be "off" and transistor M8 will pull node D to $V_{SS}$ ground, thereby holding transistor M6 "off". Due to inherent electrical characteristics of transistor M7, the transistor M7 will not turn "on" until the input voltage $V_{IN}$ at source terminal 49 exceeds the upper threshold bias voltage $V_P$ at gate terminal 45 by an amount of a p-channel voltage threshold. Since the upper threshold bias voltage $V_P$ is one p-channel threshold below the upper rail voltage $V_{DD}$, transistor M7 will not turn "on" until the input voltage $V_{IN}$ reaches upper rail voltage $V_{DD}$. When the input voltage $V_{IN}$ tries to rise above the upper rail voltage $V_{DD}$, transistor M7 will start to conduct thereby pulling node D "high". In turn, node D going "high" will turn "on" transistor M6 and try to pull the input voltage $V_{IN}$ below the upper rail voltage $V_{DD}$.

Transistors M3, M4 and M5 will perform a function similar to transistors M6, M7 and M8 for clamping and thus preventing input voltage $V_{IN}$ from going below the lower rail voltage $V_{SS}$. In doing so, a first gain stage formed by transistors M4 and M5 operate to turn "on" second clamping transistor M3. Since the gate terminal 37 of transistor M5 is connected to lower threshold voltage $V_N$, the gate terminal 37 of transistor M5 will be at approximately $V_{SS}$ plus an n-channel threshold. The gate terminal 31 of transistor M4, which is connected to the threshold voltage $V_P$, will act as a current mirror to transistor M1 in the bias circuit 10. If the input voltage $V_{IN}$ is greater than the lower rail voltage $V_{SS}$, then transistor M5 will be "off" and transistor M4 will pull node C to $V_{DD}$, thereby holding transistor M3 "off". Due to inherent electrical characteristics of transistor M5, the transistor M5 will not turn "on" until the input voltage $V_{IN}$ at source terminal 39 drops below the lower threshold bias voltage $V_N$ at gate terminal 37 by an amount of an n-channel threshold voltage. Since the lower threshold bias voltage $V_N$ is one n-channel threshold voltage above the lower rail voltage $V_{SS}$, transistor M5 will not turn "on" until the input voltage $V_{IN}$ reaches lower rail voltage $V_{SS}$. When the input voltage $V_{IN}$ tries to fall below the lower rail voltage $V_{SS}$, transistor M5 will start to conduct thereby pulling node C "low". In turn, node C going "low" will turn "on" transistor M3 and try to pull the input voltage $V_{IN}$ above the lower rail voltage $V_{SS}$.

Transistors M1 and M2 as described in relation to the bias circuit 10 are preferably multiple parallel devices in similar size to the transistors employed in the voltage clamping circuit 20. In effect, transistors M1 and M2 further divide down the current to the transistors in the clamping circuit 20. However, it should be appreciated that varying size transistors may be employed as should be obvious to one skilled in the art. Furthermore, it should be noted that the use of p-channel and n-channel transistors as described in relation to each transistor may be modified without departing from the spirit of the invention. This may include employing transistors which will achieve different desired amounts of n-channel or p-channel thresholds.

While this invention has been disclosed in connection with a particular example thereof, no limitation is intended thereby except as defined in the following claims. This is because a skilled practitioner recognizes that other modifications can be made without departing from the spirit of this invention after studying the specification and drawings.

I claim:

1. A voltage clamping circuit for clamping voltage inputs to CMOS devices so as to prevent input voltages from deviating from a rail-to-rail voltage operating range, said circuit comprising:

input means for receiving an input voltage;

means for generating an upper threshold bias voltage and a lower threshold bias voltage;

a first clamping transistor coupled to the input means for clamping the input voltage so as to prevent the input voltage from rising above an upper rail voltage;

a second clamping transistor coupled to the input means for clamping the input voltage so as to prevent the input voltage from dropping below a lower rail voltage;

first gain circuitry including first and second gain transistors for turning on the first clamping transistor in response to the upper threshold bias voltage and the input voltage so as to cause the first clamping transistor to clamp the input voltage;

second gain circuitry including third and fourth gain transistors for turning on the second clamping transistor in response to the lower threshold bias voltage and input voltage so as to cause the second clamping transistor to clamp the input voltage; and output means for providing a voltage clamp output within the rail-to-rail voltage range, wherein said lower threshold bias voltage provides a bias for the second gain transistor and further provides a reference voltage for the third gain transistor, and the upper threshold bias voltage provides a bias for the fourth gain transistor and further provides a reference voltage for the first gain transistor.

2. The voltage clamping circuit as defined in claim 1 wherein said means for generating the threshold bias voltages comprises:

a first bias circuit including a PMOS device for receiving the upper rail voltage and for providing a p-channel threshold drop to the upper rail voltage so as to generate the upper threshold bias voltage; and a second bias circuit including an NMOS device for receiving the lower rail voltage and producing an n-channel threshold increase to the lower rail voltage so as to generate the lower threshold bias voltage.

3. The voltage clamping circuit as defined in claim 1 further comprising a first feedback capacitor coupled between the first gain circuitry and the first clamping transistor and a second feedback capacitor coupled between the second gain circuitry and the second clamping transistor.

4. A voltage clamping circuit for clamping voltage inputs to CMOS devices so that the CMOS device voltage inputs do not deviate from a rail-to-rail operating range, said voltage clamping circuit comprising:

input means for receiving an input voltage;

first bias circuit means including a first input for receiving an upper rail voltage and a PMOS device for providing a p-channel threshold drop to the upper rail voltage so as to generate an upper threshold bias voltage;

second bias circuit means including a second input for receiving a lower rail voltage and an NMOS device for providing an n-channel increase to the lower rail voltage so as to generate a lower threshold bias voltage;

a first clamping transistor coupled to the input means for clamping the input voltage so as to prevent the input voltage from rising above the upper rail voltage;

a second clamping transistor coupled to the input means for clamping the input voltage so as to prevent the input voltage from dropping below the lower rail voltage;

a first transistor-based gain means for controlling the first clamping transistor in response to the upper threshold bias voltage and the input voltage so as to cause the first clamping transistor to clamp the input voltage;

a first capacitor coupled between the first clamping transistor and the first transistor-based gain means;

a second transistor-based gain means for controlling the second clamping transistor in response to the lower threshold bias voltage and the input voltage so as to cause the second clamping transistor to clamp the input voltage;

a second capacitor coupled between the second clamping transistor and the second transistor-based gain means; and output means for providing a voltage clamp output within the rail-to-rail voltage range.

5. The voltage clamping circuit as defined in claim 4 wherein said first and second transistor-based gain means comprise at least one transistor for controlling the first clamping transistor and at least another transistor for controlling the second clamping transistor.

6. A voltage clamping circuit for preventing input voltages from rising above an upper rail voltage limit comprising:

input means for receiving an input voltage;

bias circuit means including an input for receiving a rail voltage and a PMOS device for providing a p-channel threshold voltage drop to the rail voltage so as to generate a threshold bias voltage;

a clamping transistor coupled to the input means for clamping the input voltage so as to prevent the input voltage from rising above the rail voltage;

gain means including first and second gain transistors for controlling the clamping transistor in response to the threshold bias voltage and the input voltage so as to cause the clamping transistor to clamp the input voltage, wherein the threshold bias voltage provides a bias and a reference voltage; and output means for providing a voltage clamped output signal.

7. The voltage clamping circuit as defined in claim 6 wherein said bias circuit means comprises a p-channel transistor coupled to a rail voltage to reduce the rail voltage by one p-channel threshold so as to generate the bias voltage.

8. The voltage clamping circuit as defined in claim 6 further comprising a feedback capacitor coupled between the clamping transistor and the gain means.

9. A voltage clamping circuit for preventing input voltages from dropping below a lower rail voltage limit comprising:

input means for receiving an input voltage;

bias circuit means including an input for receiving a rail voltage and a NMOS device for providing an n-channel threshold voltage increase to the rail voltage so as to generate a threshold bias voltage;

a clamping transistor coupled to the input means for clamping the input voltage so as to prevent the input voltage from dropping below the rail voltage;

gain means including first and second gain transistors for controlling the clamping transistor in response to the threshold bias voltage and the input voltage so as to cause the clamping transistor to clamp the input voltage, wherein the threshold bias voltage provides a bias and reference voltage; and output means for providing a voltage clamped output signal.

10. The voltage clamping circuit as defined in claim 9 wherein said bias circuit means comprises a bias transistor coupled to a rail voltage to reduce the rail voltage by one n-channel threshold so as to generate the threshold bias voltage.

11. A method for clamping voltage inputs to CMOS type devices so as to prevent an input voltage from deviating from a rail-to-rail voltage operating range, said method comprising:

receiving an input voltage;

generating an upper threshold bias voltage that is less than a given upper rail voltage;

generating a lower threshold bias voltage that is greater than a given lower rail voltage;

applying the upper threshold bias voltage as a reference to a first gain stage for controlling the first clamping transistor and as a bias to a load of a second gain stage for controlling the second clamping transistor;

applying the lower threshold bias voltage as a reference to the second gain stage for controlling the second clamping transistor and as a bias to a load of the first gain stage;

controlling first and second clamping transistors in response to said upper and lower threshold bias voltages and the input voltage;

turning on the first clamping transistor when the input voltage rises to the upper rail voltage so as to prevent the input voltage from rising above the upper rail voltage; and turning on the second clamping transistor when the input voltage drops to the lower rail voltage so as to prevent the input voltage from dropping below the lower rail voltage.

12. The method as defined in claim 11 wherein the steps of generating said upper and lower threshold bias voltages comprise:

subtracting a p-channel voltage threshold drop from the upper rail voltage to produce said upper threshold bias voltage; and adding an n-channel voltage threshold rise to said lower rail voltage to produce the lower threshold bias voltage.

* * * * *